(12) United States Patent
Chiu

(10) Patent No.: US 6,818,963 B1
(45) Date of Patent: Nov. 16, 2004

(54) SURFACE MOUNT PACKAGE FOR LINEAR ARRAY SENSORS

(75) Inventor: Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 405 days.

(21) Appl. No.: 09/656,985

(22) Filed: Sep. 7, 2000

(51) Int. Cl.[7] ............... H01L 31/0203; H01L 31/0232; H01L 21/44; H01L 21/48; H01L 23/495

(52) U.S. Cl. ................ 257/433; 257/432; 257/443; 257/436; 257/291; 257/666; 257/787; 438/112; 438/113; 438/127; 438/48; 438/66; 438/26; 438/27; 438/29; 438/33; 438/64

(58) Field of Search ............................ 257/433, 443, 257/432, 291, 666, 787, 48, 66, 680, 81, 100, 112, 123; 438/112, 113, 127, 48, 64–69, 33, 26–29, 73, 80, 123; 425/121, 117, 127; 264/272.17, 272.14

(56) References Cited

U.S. PATENT DOCUMENTS

| | | | | |
|---|---|---|---|---|
| 4,894,707 A | * | 1/1990 | Yamawaki et al. | 357/74 |
| 5,384,286 A | * | 1/1995 | Hirai | 437/207 |
| 5,622,873 A | * | 4/1997 | Kim et al. | 438/65 |
| 5,686,698 A | * | 11/1997 | Mahadevan et al. | 174/52.4 |
| 5,776,800 A | * | 7/1998 | Hamburgen et al. | 438/122 |
| 5,814,881 A | * | 9/1998 | Alagaratnam et al. | 257/686 |
| 6,171,879 B1 | * | 1/2001 | Chan et al. | 438/52 |
| 6,252,252 B1 | * | 6/2001 | Kunii et al. | 257/81 |
| 6,255,741 B1 | * | 7/2001 | Yoshihara et al. | 257/792 |
| 6,300,169 B1 | * | 10/2001 | Weiblen et al. | 438/127 |

* cited by examiner

Primary Examiner—Nitin Parekh
(74) Attorney, Agent, or Firm—Lisa K. Jorgenson; William A. Munck

(57) ABSTRACT

In linear arrays of charge coupled device photosensors, sensor integrated circuits are contained in surface mountable packaging allowing individual segments to be soldered into place within the array. For solder-mountable packaging, unencapsulated sensor circuits are mounted onto a lead frame strip with the space between the circuits equaling the width of a singulation saw. After die mounting and wire bonding, a continuous strip of plastic or resin molding covers the wire bonds on one side and the edge of the silicon on the other, protecting the lead frame strip and other parts, leaving the active sensor area exposed. The lead frame is then trimmed and formed in a conventional manner, and the packaged sensor circuits are separated with a singulation saw cutting between the circuits. The resulting self-contained device may then be surface mounted within a linear array with solder rather than depending on Chip On Board technology. Leads are preferably soldered to the board on only one side, with the other side floating freely over the appropriate contacts for ease of mechanical adjustment. Individual sensor segments within the array may be readily removed and replaced in the event of a defect.

13 Claims, 3 Drawing Sheets

SURFACE MOUNT PACKAGE FOR LINEAR ARRAY SENSORS

BACKGROUND OF THE INVENTION

1. Field of the Invention

The present invention relates in general to packaging and mounting semiconductor devices and in particular to packaging and mounting semiconductor photo transmitter/receiver (transceiver) devices in linear arrays. Still more particularly, the present invention relates to packaging semiconductor devices in a linear array of photosensors having a total length much greater than the size of a substrate on which the devices are formed.

2. Description of the Prior Art

The prevalence of imaging systems in contemporary consumer electronics relies in large measure on the fabrication of photosensors composed of charge coupled devices and CMOS devices. The charge coupled devices serve as photosensitive elements, with photons (light) impacting the surface of the charge coupled device creating charge at the terminals of the device. While a single sensing element detects light only at a single point, an array of sensing elements can detect variations of light reflected off an object being imaged as a function of position in a line or plane, enabling electronic encoding of a digital image of the object. Arrays of charge coupled devices find wide use in electronic products ranging from digital cameras to telecopier (facsimile or "fax") machines.

In some products, a linear array of photosensors detects a narrow line (often one or two pixels wide) of light reflected from the object being imaged. Moving the sensors relative to the object and/or the object relative to the sensors by the width of the array creates an adjacent linear image, a process which may be repeated with the adjacent linear images (also called optical lines) combined to form a two-dimensional image. In the case of flat-bed scanners, the sensor array typically moves relative to the scanned page to capture the image, while fax machines generally move the paper across the sensors. Use of a linear array to capture two-dimensional images reduces system cost since fewer sensor units are required.

Linear arrays of photosensors are typically manufactured from strips of integrated circuits containing charge coupled devices and mounted on printed circuit boards. Currently, the integrated circuits are mounted in an unencapsulated silicon form, then connected to a power supply and other support electronics mounted on the printed circuit board through the use of gold bond wires. The bond wires are then protected utilizing liquid encapsulation or silicon gel. This technique, often referred to as "Chip On Board" technology, provides ease of manufacture in production of sensor arrays having charge coupled devices as well as other integrated circuit designs.

However, Chip On Board technology causes removal and replacement of a defective integrated circuit segment from a linear array to be prohibitively difficult. Simple removal of an integrated circuit segment from a linear array for replacement is simply not possible in an economical manner. An array containing a defective segment must therefore simply be discarded. As the length of linear arrays increases, and the array includes more integrated circuit segments, the likelihood of at least one segment being or becoming defective increases substantially. Therefore, maintaining an acceptable yield in the linear array production constrains the length of arrays, a problematic limitation in that the number of parts and manufacturing steps in producing devices utilizing the linear arrays is increased. The limitation on array length also requires use of multiple linear arrays where designers would prefer a single linear array of greater length. Furthermore, multiple arrays must be aligned relative to each other during assembly.

It would be desirable, therefore, to produce linear arrays with greater length and more easily replaceable integrated circuit segments.

SUMMARY OF THE INVENTION

In linear arrays of charge coupled device photosensors, the sensor integrated circuits are contained in surface mountable packaging allowing individual segments to be soldered into place within the array. For solder-mountable packaging, unencapsulated sensor circuits are mounted onto a lead frame strip with the space between the circuits equaling the width of a singulation saw. After die mounting and wire bonding, a continuous strip of plastic or resin molding covers the wire bonds on one side and the edge of the silicon on the other, protecting the lead frame strip and other parts, leaving the active sensor area exposed. The lead frame is then trimmed and formed in a conventional manner, and the packaged sensor circuits are separated with a singulation saw cutting between the circuits. The resulting self-contained device may then be mounted within a linear array with solder rather than depending on Chip On Board technology. Leads are preferably soldered to the board on only one side, with the other side floating freely over the appropriate contacts for ease of mechanical adjustment. Individual sensor segments within the array may be readily removed and replaced in the event of a defect.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuit packages. The present invention can be practiced in conjunction with integrated circuit package fabrication techniques currently used in the art, and only so much of the commonly practiced process steps are included as are necessary for an understanding of the present invention. The figures showing portions of an integrated circuit package during fabrication are not necessarily drawn to scale, but instead are drawn so as to illustrate the important features of the invention.

Figure 1:
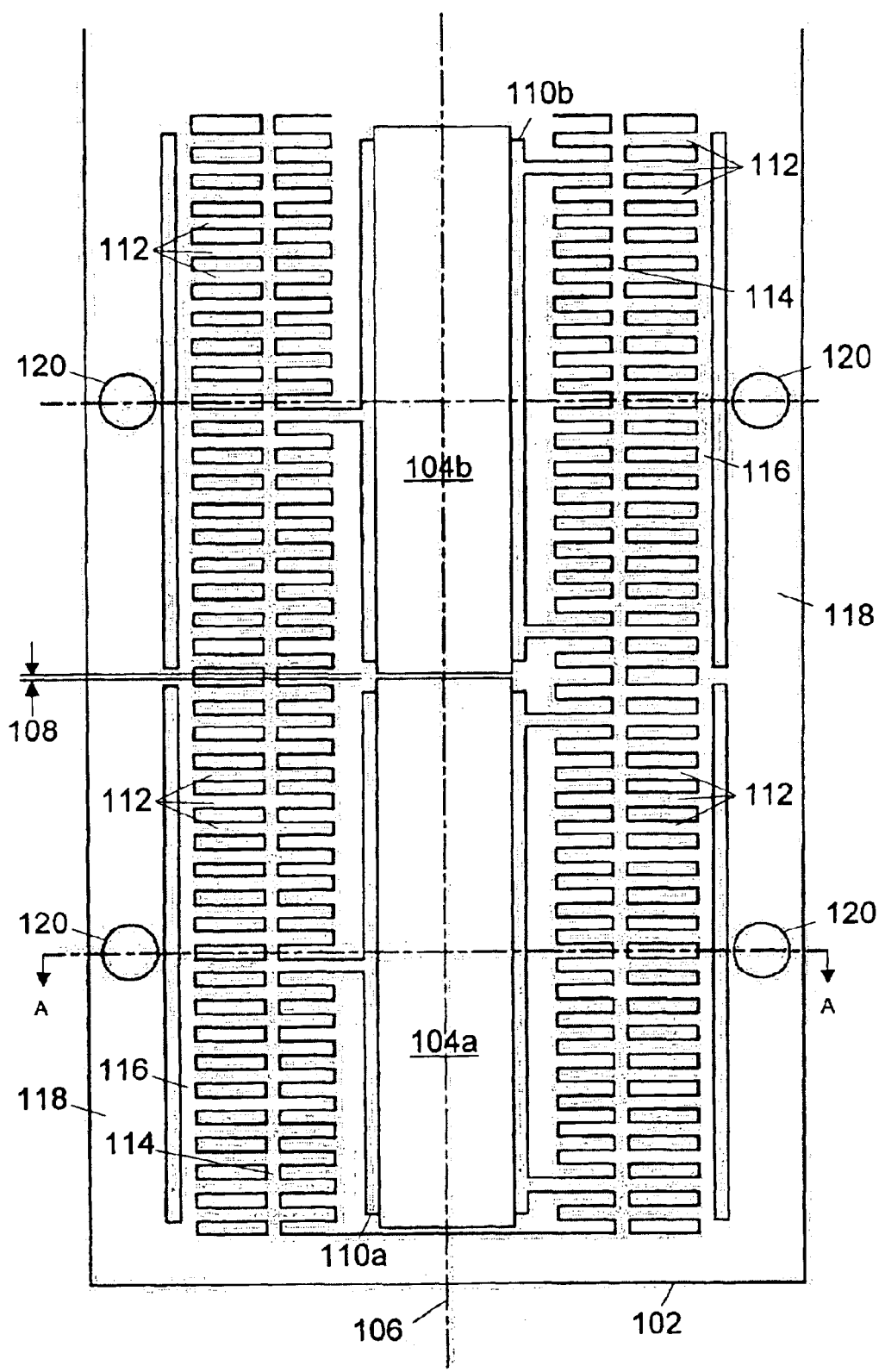
FIG. 1 depicts a pair of integrated circuit devices mounted on a lead frame strip, prior to completion of packaging, in accordance with the preferred embodiment of the present invention.

With reference now to the figures, and in particular with reference to FIG. 1, a lead frame strip on which integrated circuit sensor devices are mounted, prior to completion of packaging in accordance with the preferred embodiment of the present invention, is depicted. In the figure, the integrated circuit sensor device die 104a–104b are mounted on a metal alloy (typically either iron-nickel or copper based) lead frame strip 102 aligned collinearly along a centerline 106, and contain conventional sensor devices for detecting variations in ambient light. The two integrated circuit sensor segments 104a–104b are separated by a space 108 approximately equal to the kerf width of a singulation saw, about 50 microns. Charge coupled devices or other photosensitive devices are formed in a line along the length of the integrated circuit segments 104a–104b up to the edges of the respective die adjoining space 108. Additional sensor device die (not shown) may be similarly mounted on the remaining portion of the lead frame strip 102.

As in the conventional art, lead frame strip 102 may be formed by stamping and masked etching, and includes a plurality of lead frames each having centrally located supports 110a, 110b to which the integrated circuit die will later attach (commonly referred to as a "die paddle") and a network of leads 112. Die paddles 110a and 110b are shorter in length than the integrated circuit die which will be mounted on the lead frames within lead frame strip 102, so that spacing between adjacent integrated circuit die is limited by the length of the die. Metal strips (dam bars) 114, located between the leads at points which will eventually lie just outside the edge of the completed molded packages, prevent molten encapsulant which seeps from the mold fixture from flowing out onto the leads and later adversely affecting lead trim and form operations. Additional bars (shorting bars) 116, located between the lead tips, provide protection of the leads from mechanical damage during processing and handling. Generally a number of lead frames are temporarily connected together via larger shorting strips (bars) 118 to facilitate automated processing. Alignment or "tooling" holes 120 in the lead frame strip 102 allow for automated handling, attachment of the remaining parts of the circuit to the lead frame, and encapsulation of the mounted die 104a–104b.

Integrated circuit die 104a–104b are affixed to the die paddles 110a–110b of the lead frame utilizing an adhesive, such as polymers (including resin-based epoxies and polymides), solder, or gold eutectic. Integrated circuit die 104a–104b are mounted with a separation approximately equal to a kerf width of a singulation saw which will be used to separate packaged integrated circuits. Once each integrated circuit die 104a–104b is affixed to the lead frame strip 102, wire bonding will typically create connections between bond pads on the integrated circuit surface and leads 112 providing electrical connection to outside electronic parts. Small gold wires are welded or soldered (usually thermosonic gold wirebonding) between bond pads and selected leads 112 to create "pins" for the completed, packaged circuit.

Figure 2:
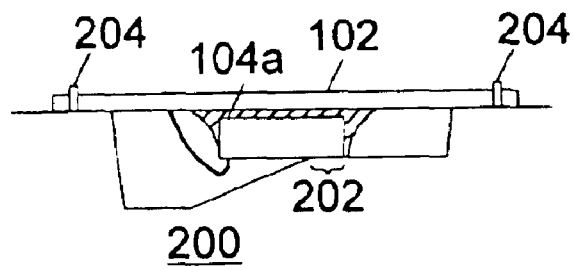
FIG. 2 is a cross-sectional view of a mold and lead frame strip employed in packaging sensor circuits in accordance with a preferred embodiment of the present invention.

Referring to FIG. 2, a cross-sectional view of a mold and lead frame strip employed in packaging sensor circuits in accordance with a preferred embodiment of the present invention is illustrated. The figure illustrates a cross-section of lead frame strip 102 depicted in FIG. 1 taken at section lines A-A and of a mold when the lead frame strip 102 is mounted to the mold 200 for encapsulation of the integrated circuit die 104a. When lead frame strip 102 with integrated circuit die 104a is mounted to mold 200, a portion 202 of the mold 200, about 100–200 $\mu$m in width, abuts the surface of integrated circuit die 104a on which the photosensitive devices are formed, preventing the encapsulating material from forming on that portion of the integrated circuit die surface and leaving that portion exposed. In general, this part of the mold that is in contact with the silicon chip surface is made from soft material such as silicone rubber or cushioned by a polyimide film. Portion 202 of mold 200 extends to an edge of the integrated circuit die 104a, and a sloped surface of mold 200 provides a mold cavity region in which wire bonds may be encapsulated. The cavity includes several similar regions for receiving each integrated circuit die and attached bond wires which are affixed to the lead frame strip. Mold 200 also includes tooling pins 204 projecting from a surface adjacent the mold cavity region and received by tooling or alignment holes 120 within the lead frame strip 102.

Lead frame strip 102 and integrated circuit die 104a are then molded with a thermosetting resin or thermoplastic injected into the open spaces of mold 200, covering a portion of the lead frame 102 and the integrated circuit die 104a except for the surface abutting mold portion 202. The plastic or resin will also cover bond wires and will adhere to the surfaces of all of the parts exposed to the resin, further securing the integrated circuit to the lead frame. The sensor portion on which the charge coupled devices which actually receive the photon are formed, however, will remain uncovered, allowing light from the object being imaged to reach the photosensors. Various encapsulation processes (including transfer molding, injection molding, and reaction-injection molding) may be employed.

After the formation of the epoxy or plastic covering using mold 200, the lead frame strip 102 trim and form operations commence to create connections easily available in mounting the integrated circuit device to other pieces of electronic equipment. Singulation is performed by sawing through the packaging and lead frame strip between the integrated circuit die 104a and 104b within the gap 108 left for that purpose.

Figure 3A:
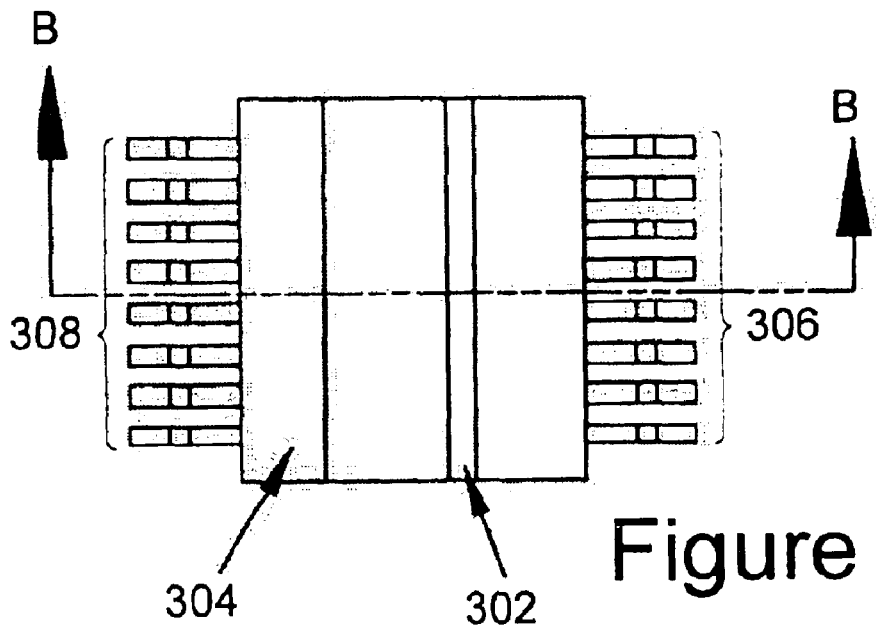
FIGS. 3A–3B depict plan and cross-sectional views of a packaged sensor device in accordance with the preferred embodiment of the present invention.
Figure 3B:
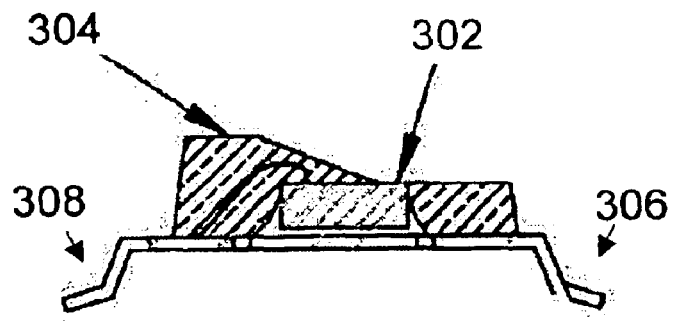

With reference now to FIGS. 3A and 3B, plan and cross-sectional views of a packaged sensor device in accordance with the preferred embodiment of the present invention are depicted. The packaged device contains the integrated circuit sensor device with a sensor region 302 exposed, not covered by the packaging plastic or resin 304 which otherwise encapsulates the integrated circuit die, the portion of the lead frame to which the sensor die is affixed, and the bond wires and adhesive connecting the sensor die to the lead frame.

The packaged integrated circuit also includes leads 306 on one side and leads 308 on the other. In the assembled linear array, one set of leads 306 is preferably soldered into place while the other set 308 floats freely over the contacts to provide ease of mechanical adjustment in the finished array. Solder around the soldered leads 306 may be reflowed to allow removal of defective finished packages from the array.

Figure 4:
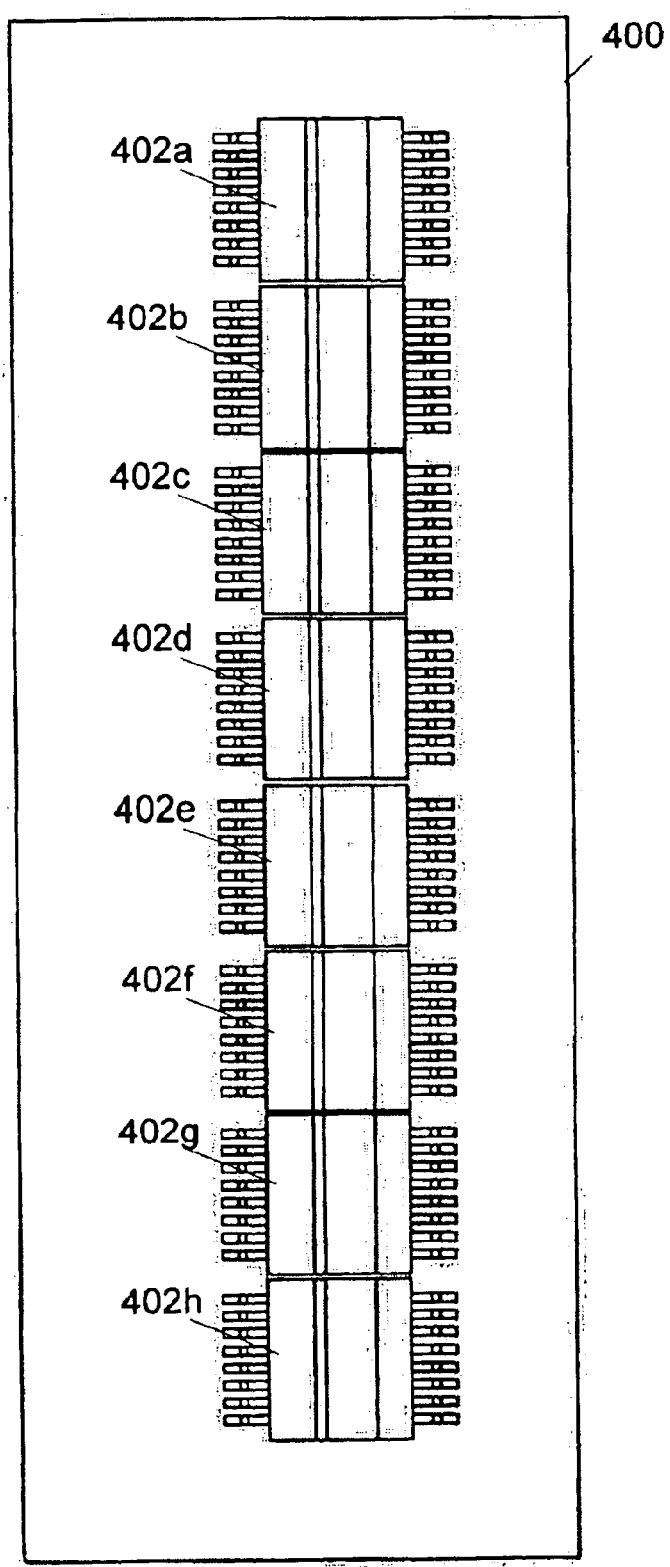
FIG. 4 is a plan view of several completed and packaged integrated circuit sensor devices mounted on a printed circuit board to form a linear sensor array in accordance with a preferred embodiment of the present invention.

Referring to FIG. 4, a plan view of several completed and packaged integrated circuit sensor devices mounted on a printed circuit board to form a linear sensor array in accordance with a preferred embodiment of the present invention is illustrated. A printed circuit board 400 is shown on which several completed circuit packages 402a–402h are mounted, with the exposed region of each package aligned. Errors in alignment may be offset by control circuitry or software compensation. As noted above, preferably leads on one side of each package 402a–402h are soldered while leads on the other side remain in floating contact with conductive structures on the printed circuit board 400. Alignment may be adjusted by "floating" the soldered leads. The minimum possible space between each pair of adjacent packages 402a–402b, 402b–402c, 402c–402d, 402d–402e, 402e–402f, 402f–402g, and 402g–402h within the linear array is maintained, preferably with adjacent packages in contact with each other if possible so that less than one pixel width of dead space is created between discrete linear array packages. Even with automated mounting of packages 402a–402h on circuit board 400, spacing of less than 10 microns between adjacent packages should be possible, and image correction and extrapolation algorithms may be employed to derive image data for portions of optical lines which are not directly imaged due to such spacing. A 10 $\mu$m pixel is equivalent to 2540 dpi (dots per inch). For fax machines and other coarse scanning devices, such spacing is adequate to provide satisfactory imaging resolution. Alternatively, two lines of staggered packages may be mounted on the circuit board 400 to obtain greater resolution.

The present invention allows individually packaged integrated circuit sensor segments within a linear array to be easily removed by soldering the segments into place on the circuit board rather than affixing the sensor segments to the board with a silicon gel or liquid encapsulation coating. Replacement of a single segment after discovery of a defect is thus enabled. Since the cost of replacing a single integrated circuit package is far less than the cost of discarding an entire linear array containing a single defective sensor segment, the present invention should allow for the construction of far longer linear arrays, and high resolution arrays of multiple rows.

While the invention has been particularly shown and described with reference to a preferred embodiment, it will be understood by those skilled in the art that various changes in form and detail may be made therein without departing from the spirit and scope of the invention.

What is claimed is:

1. A method of forming a linear photosensor array, comprising:
    forming a plurality of integrated circuits each including
        photosensors formed in a line along a length of the integrated circuit within a portion of the integrated circuit remaining exposed after packaging, and
        a plurality of conductive leads adapted for soldering to a circuit board;
    mounting a plurality of integrated circuit die on a lead frame strip with a separation between the mounted integrated circuit die approximately equal to a kerf width for a singulation saw to be used in separating the packaged integrated circuits;
    mounting the integrated circuits with the portions containing the photosensors in alignment on a circuit board; and
    soldering at least some of the leads for each integrated circuit to the circuit board.

2. The method of claim 1, comprising:
    packaging each of the plurality of integrated circuit packages by:
        affixing the integrated circuit die to the lead frame strip;
        connecting the integrated circuit die to selected portions of the lead frame strip with bond wires; and
        encapsulating a portion of the lead frame strip and the integrated circuit die except for the exposed region, wherein the exposed region of the integrated circuit die remains exposed to external ambient light.

3. The method of claim 2, comprising:
    after affixing the integrated circuit die to the lead frame strip and connecting the bond wires, mounting the lead frame strip with the integrated circuit die and bond wires in a mold with a portion of the mold in contact with the exposed region of the integrated circuit die to prevent encapsulating material from adhering to the exposed region of the integrated circuit die.

4. The method of claim 3, further comprising:
    mounting the lead frame strip with the integrated circuit die and bond wires in a mold having a sloped surface adjacent to the portion of the mold contacting the exposed region of the integrated circuit die, wherein the sloped surface forms one surface of a mold cavity receiving the bond wires when the lead frame strip with the integrated circuit die is mounted in the mold.

5. A method of forming a linear photosensor array, comprising:
    forming a plurality of integrated circuits each including
        photosensors formed in a line along a length of the integrated circuit within a portion of the integrated circuit remaining exposed after packaging, and
        a plurality of conductive leads adapted for soldering to a circuit board; packaging the integrated circuits with the portion containing the photosensors exposed; and
    mounting the integrated circuits with the portions containing the photosensors in alignment on a circuit board, including mounting adjacent packaged integrated circuits in contact with each other; and
    soldering at least some of the leads for each integrated circuit to the circuit board.

6. A method of forming a linear photosensor array, comprising:
    forming a plurality of integrated circuits each including
        photosensors formed in a line along a length of the integrated circuit within a portion of the integrated circuit remaining exposed after packaging, and
        a plurality of conductive leads adapted for soldering to a circuit board;
    mounting the integrated circuits with the portions containing the photosensors in alignment on a circuit board; and
    soldering at least some of the leads for each integrated circuit to the circuit board, including soldering only leads on one side of each integrated circuit to the circuit board, leaving leads on an other side of the packaged integrated circuits in floating contact with conductive structures on the circuit board to facilitate adjustment and removal of integrated circuits.

7. An integrated circuit package for a linear photosensor array, comprising:
    a lead frame including a die paddle and a plurality of leads;
    an integrated circuit die affixed to the die paddle, the integrated circuit die including a plurality of photosensitive devices linearly aligned along a length of an upper surface of the integrated circuit die; and
    packaging material encapsulating a portion of the leaf frame and the integrated circuit die except for a region of the integrated circuit die containing the photosensitive devices, wherein the region containing the photosensitive devices remains exposed through the packaging material, and wherein the packaging material does not cover ends of the integrated circuit die.

8. The integrated circuit package of claim 7, wherein the die paddle of the lead frame is shorter in length than the integrated circuit die.

9. The integrated circuit package of claim 7, wherein the integrated circuit is affixed to the lead frame with an adhesive.

10. The integrated circuit package of claim 7, further comprising:

bond wires connecting the integrated circuit die to selected portions of the lead frame, wherein the packaging material encapsulates the bond wires.

11. A linear photosensor array, comprising:

a circuit board; and a plurality of packaged integrated circuits mounted on the circuit board, wherein each packaged integrated circuit includes an array of photosensors linearly aligned along a length of a surface region of an integrated circuit die therein and a plurality of conductive leads adapted for soldering to the circuit board, wherein the packaged integrated circuits are mounted in a line on the circuit board with the surface regions of each packaged integrated circuit in alignment, wherein adjacent packaged integrated circuits on the circuit board are mounted in contact with each other such that the array of photosensors on each integrated circuit die form a single, long continuous photosensor array, and wherein at least some of the leads for each packaged integrated circuit are soldered to the circuit board.

12. A linear photosensor array, comprising:

a circuit board; and a plurality of packaged integrated circuits mounted on the circuit board, wherein each packaged integrated circuit includes an array of photosensors linearly aligned along a length of a surface region of an integrated circuit die therein and a lead frame having a plurality of conductive leads adapted for soldering to the circuit board, wherein the packaged integrated circuits are mounted in a line on the circuit board in contact with each other with the surface regions of each packaged integrated circuit in alignment, wherein at least some of the leads for each packaged integrated circuit are soldered to the circuit board, wherein each of the integrated circuit packages further comprises:

bond wires connecting the integrated circuit die to selected portions of the lead frame; and packaging that encapsulates the bond wires, a portion of the lead frame, and the integrated circuit die except for the surface region containing the array of photosensors and ends of the integrated circuit die, and wherein the surface region of the integrated circuit die containing the array of photosensors remains exposed to ambient light.

13. A linear photosensor array, comprising:

a circuit board; and a plurality of packaged integrated circuits mounted on the circuit board, wherein each packaged integrated circuit includes an array of photosensors linearly aligned along a length of a surface region of an integrated circuit die therein and a plurality of conductive leads adapted for soldering to the circuit board, wherein the packaged integrated circuits are mounted in a line on the circuit board with the surface regions of each packaged integrated circuit in alignment, wherein at least some of the leads for each packaged integrated circuit are soldered to the circuit board, and wherein only leads on one side of each packaged integrated circuit mounted on the circuit board are soldered to the circuit board, while leads on an other side of each packaged integrated circuit are left in floating contact with conductive structures on the circuit board to facilitate adjustment and removal of packaged integrated circuits.

* * * * *